United States Patent
Maeda

(10) Patent No.: US 6,173,235 B1
(45) Date of Patent: *Jan. 9, 2001

(54) METHOD OF ESTIMATING LIFETIME OF FLOATING SOI-MOSFET

(75) Inventor: Shigenobu Maeda, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/709,079

(22) Filed: Sep. 6, 1996

(30) Foreign Application Priority Data

Apr. 11, 1996 (JP) .................... 8-89156

(51) Int. Cl.[7] ................................. G01R 31/26
(52) U.S. Cl. ................ 702/58; 702/117; 324/769; 438/14; 438/17
(58) Field of Search ................. 364/480, 481, 364/551.01, 552, 578; 324/537, 765, 766, 769, 770; 257/66, 69, 213, 236, 288, 314, 315; 437/8, 913, 923; 702/57, 58, 64, 81, 182, 183, 117; 438/4, 14, 15, 16, 17, 18, 197

(56) References Cited

U.S. PATENT DOCUMENTS

| 4,816,753 | * | 3/1989 | Palkuti ................. 324/501 |
| 5,196,354 | * | 3/1993 | Ohtaka et al. ......... 437/923 |
| 5,608,338 | * | 3/1997 | Maeda ................... 324/770 |

OTHER PUBLICATIONS

Ong et al., "Hot–Carrier–Induced Degradation in p–MOSFET's Under AC Stress", IEEE Electron Device Letters, vol. 9, No. 5, May 1988, pp. 211–213.*

Kuo et al., "Simulation of MOSFET Lifetime under AC Hot–Electron Stress", IEEE Trans. on Electron Devices, vol. 35, No. 7, Jul. 1988, pp. 1004–1011.*

Werner Weber, "Dynamic Stress Experiments for Understanding Hot–Carrier Degradation Phenomena", IEEE Trans. on Electron Devices, vol. 35, No. 9, Sep. 1988, pp. 1476–1486.*

Ong et al., "p–MOSFET Gate Current and Device Degradation", 27th Annual Proceedings on Reliability Physics 1989, Apr. 1989, pp. 178–182.*

Ong et al., "p–MOSFET Gate Current and Device Degradation", 1989 Intnl. Symposium on VLSI Technology, Systems, and Applications, May 1989, pp. 193–196.*

Mistry et al., "An Empirical Model for the $L_{eff}$ Dependence of Hot–Carrier Lifetimes of n–Channel MOSFET's", IEEE Electron Device Letters, vol. 10, No. 11, Nov. 1989, pp. 500–502.*

Bellens et al., "On the Channel–Length Dependence of the Hot–Carrier Degradation of n–Channel MOSFET's", IEEE Electron Device Letters, vol. 10, No. 12, Dec. 1989, pp. 553–555.*

(List continued on next page.)

Primary Examiner—Eric W. Stamber
(74) Attorney, Agent, or Firm—McDermott, Will & Emery

(57) ABSTRACT

In a method of estimating the lifetime of a floating SOI-MOSFET, constants A and B, stress condition dependency $Id_t(S)$ of a drain current and stress condition dependency $Isub(S)$ of a substrate current in a body-fixed SOI-MOSFET, and stress condition dependency $Id^f(S)$ of a drain current in the floating SOI-MOSFET are obtained from experiment to estimate lifetime $\upsilon_f(S)$ from the following equation:

$$\tau^f(S) = A \cdot W^f \frac{1}{Id^f(S)} \left( \frac{Isub(S)}{Id^t(S)} \right)^{-B} \quad (5)$$

where $W^f$ represents a known channel width of the floating SOI-MOSFET.

2 Claims, 16 Drawing Sheets

OTHER PUBLICATIONS

Choi et al., "Monitoring Hot–Electron–Induced Degradation of Floating–Body SOI MOSFET's", IEEE Electron Device Letters, vol. 11, No. 4, Apr. 1990, 156–158.*

Vu et al., "Recombination Lifetime Measurements in SOI Materials Using a Depletion–Mode MOSFET", 1990 IEEE SOS/SOI Technology Conference, Oct. 1990, pp. 67–68.*

"Hot–Electron–Induced MOSFET Degradation–Model, Monitor, and Improvement" CHENMING HU, et al., 1985 IEEE, pp. 375–385.

* cited by examiner

METHOD OF ESTIMATING LIFETIME OF FLOATING SOI-MOSFET

BACKGROUND OF THE INVENTION

1. Field of the Invention

The present invention relates to methods of estimating the lifetime of a transistor degraded by hot carriers in an MOSFET and, more particularly, to a method of estimating the lifetime of a floating SOI-MOSFET.

2. Description of the Background Arts

In a bulk MOSFET, the lifetime of the transistor degraded by hot carriers can be estimated by measuring a substrate current Isub.

FIG. 21 schematically shows a cross sectional structure of a typical bulk N-channel MOSFET. In the MOSFET shown in FIG. 21, a source 2 and a drain 3 are formed at one main surface of a semiconductor substrate 1. A gate electrode 5 is formed between source 2 and drain 3 on substrate 1 with a gate insulating film 4 interposed therebetween. Substrate 1 and source 2 are connected to ground, and a drain voltage Vd is applied to drain 3 and a gate voltage Vg is applied to gate electrode 5.

In such bulk MOSFET, flow of electrons "e" through the channel region from source 2 to drain 3 may cause impact ionization as indicated by a star near drain 3. Impact ionization produces pairs of hole "h" and electron "e" which is the hot carrier with high energy. Holes "h" diffuse in substrate 1 and leave substrate 1 as substrate current Isub through a substrate electrode (or a well electrode). Substrate current Isub can be measured with an ammeter A as shown in FIG. 21.

Meanwhile, electrons "e" or hot carriers penetrate into gate insulating film 4, where they may be trapped or produce an interface state between the channel region and the gate insulating film. Such hot carriers degrade the transistor characteristics.

As can be seen from the foregoing, there is a close correlation between the substrate current and hot carriers since the substrate current is generated by hot carriers produced due to impact ionization in the vicinity of the drain. Therefore, the lifetime of a transistor degraded by hot carriers can be estimated by measuring the substrate current.

FIG. 22 schematically shows a cross sectional structure of a typical SOI-MOSFET. In this SOI-MOSFET, a buried insulating layer 6 and a semiconductor layer 1A are stacked on semiconductor substrate 1 in this order. In the SOI-MOSFET, semiconductor layer 1A is isolated from substrate 1 by buried insulating layer 6 and semiconductor layer 1A corresponds to substrate 1 in the bulk MOSFET shown in FIG. 21. Source 2 and drain 3 are formed in semiconductor layer 1A. The region of semiconductor layer 1A excluding source 2 and drain 3 is called a body region 1B. Between source 2 and drain 3, gate electrode 5 is formed on semiconductor layer 1A with gate insulating film 4 interposed therebetween. Source 2 is connected to ground, drain voltage Vd is applied to drain 3 and gate voltage Vg is applied to gate electrode 5.

As apparent from FIG. 22, generally there is no such thing as a substrate electrode in an SOI-MOSFET. Therefore, in general the lifetime of a transistor degraded by hot carriers cannot be estimated from the substrate current.

It is also understood from FIG. 22 that holes "h" produced by impact ionization tend to accumulate in body region 1B, since body region 1B is isolated from substrate 1 by buried insulating layer 6, thereby increasing the potential of the body region. Increase in potential in body region 1B turns on an NPN bipolar transistor formed by source 2, body region 1B and drain 3, thereby further increasing the current between source 2 and drain 3 (parasitic bipolar effect). The current increased by such parasitic bipolar effect leads to an increase in production of hot carriers to accelerate degradation in transistor characteristics. Thus, such parasitic bipolar effect also makes it difficult to estimate the lifetime of an SOI-MOSFET degraded by hot carriers.

FIG. 23 is a graph showing the results obtained by measuring the lifetime of the SOI-MOSFET as shown in FIG. 22. In this graph, the reciprocal $1/Vd(1/V)$ of the drain current is represented on the horizontal axis and the lifetime $\tau(\text{sec})$ of the transistor is represented on a log scale on the vertical axis. The measured SOI-MOSFET has a channel length L of 0.3 $\mu$m and gate voltage Vg of 0.7V is applied thereto as the hot carrier stress condition. As can be seen from FIG. 23, the lifetime of the transistor sharply declines in the region with greater drain voltage Vd (the left region of the graph). Thus, since plotting of the transistor lifetime does not result in a straight line, accurate estimation of the lifetime of the SOI-MOSFET is difficult. For example, drain voltage Vd allowed for the SOI-MOSFET to have the lifetime of ten years is 3.13V or lower if estimated from the two leftmost measurement points in the graph, but is 1.96V or lower if estimated from the four measurement points on the right side of the graph. Although plotting of the transistor lifetime presents in good linearity in the region with a relatively small drain voltage, measurement of the transistor lifetime in such region requires a long stress test of approximately $10^4 - 10^6$ seconds, preventing achievement of a simple lifetime estimation method.

SUMMARY OF THE INVENTION

In view of the problems as described above, an object of the present invention is to provide a method of estimating the lifetime of a floating SOI-MOSFET simply and accurately.

The method of estimating the lifetime of a floating SOI-MOSFET includes the steps of:

deriving, corresponding to at least two stress conditions $S_1$ and $S_2$, substrate currents $Isub_1$ and $Isub_2$, drain currents $Id_1^t$ and $Id_2^t$, and transistor lives $\tau_1^t$ and $\tau_2^t$ from hot carrier stress test for a body-fixed SOI-MOSFET;

using at least $Isub_1$, $Isub_2$, $Id_1^t$, $Id_2^t$, $\tau_1^t$ and $\tau_2^t$ to determine constants A and B in the following equation (2)

$$\frac{\tau^t \cdot Id^t}{W^t} = A\left(\frac{Isub}{Id^t}\right)^{-B} \tag{2}$$

which equation includes a channel width $W^t$ of the body-fixed SOI-MOSFET;

deriving, from measurement, stress condition dependency Isub(S) of the substrate current and stress condition dependency $Id^t(S)$ of the drain current for the body-fixed SOI-MOSFET, and deriving, from measurement, stress condition dependency $Id^f(S)$ of the floating SOI-MOSFET; and using A, B, Isub(S), $Id^t(S)$, and $Id^f(S)$ to calculate a lifetime $\tau^f(S)$ of the floating SOI-MOSFET under arbitrary stress conditions from the following equation (5)

$$\tau^f(S) = A \cdot W^f \frac{1}{Id^f(S)} \left( \frac{Isub(S)}{Id^t(S)} \right)^{-B} \quad (5)$$

which equation includes the known channel width $W^f$ of the floating SOI-MOSFET.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The method of estimating the lifetime of an SOI-MOSFET according to the present invention is based on the following principle.

Figure 21:
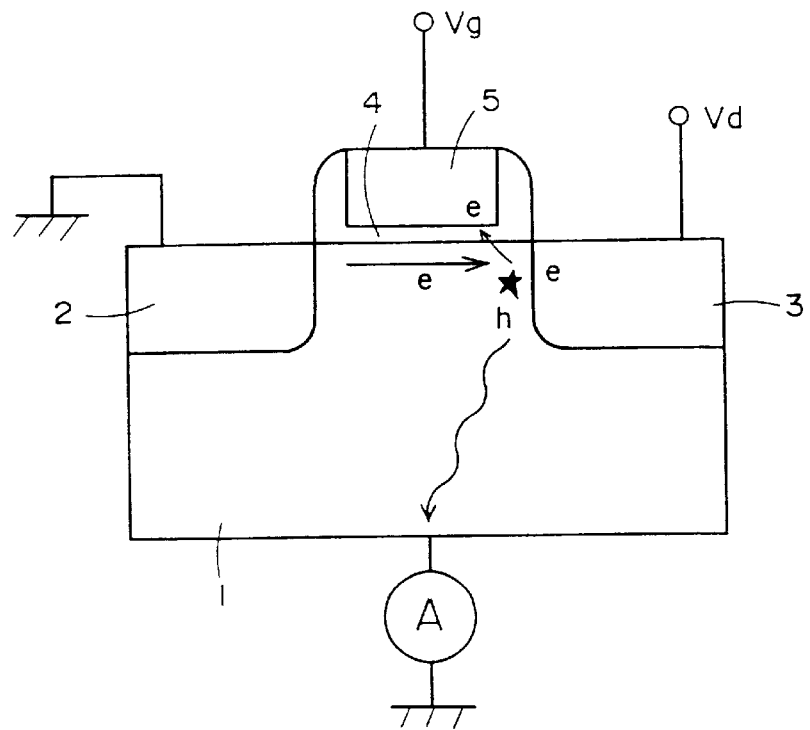
FIG. 21 is a schematic cross sectional view for use in description of estimation of the lifetime of a conventional bulk MOSFET.
Figure 22:
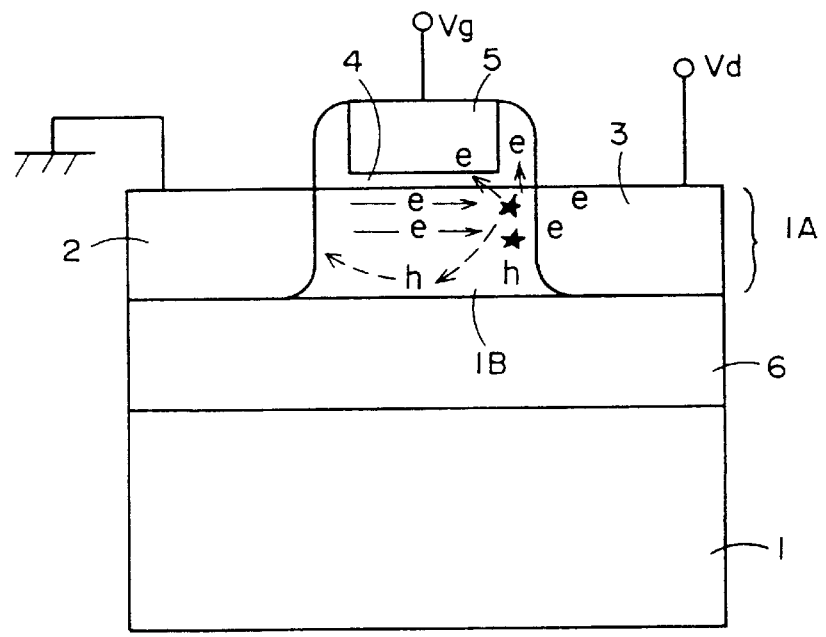
FIG. 22 is a schematic cross sectional view showing the behavior of hot carriers produced by impact ionization in a floating SOI-MOSFET.
Figure 23:
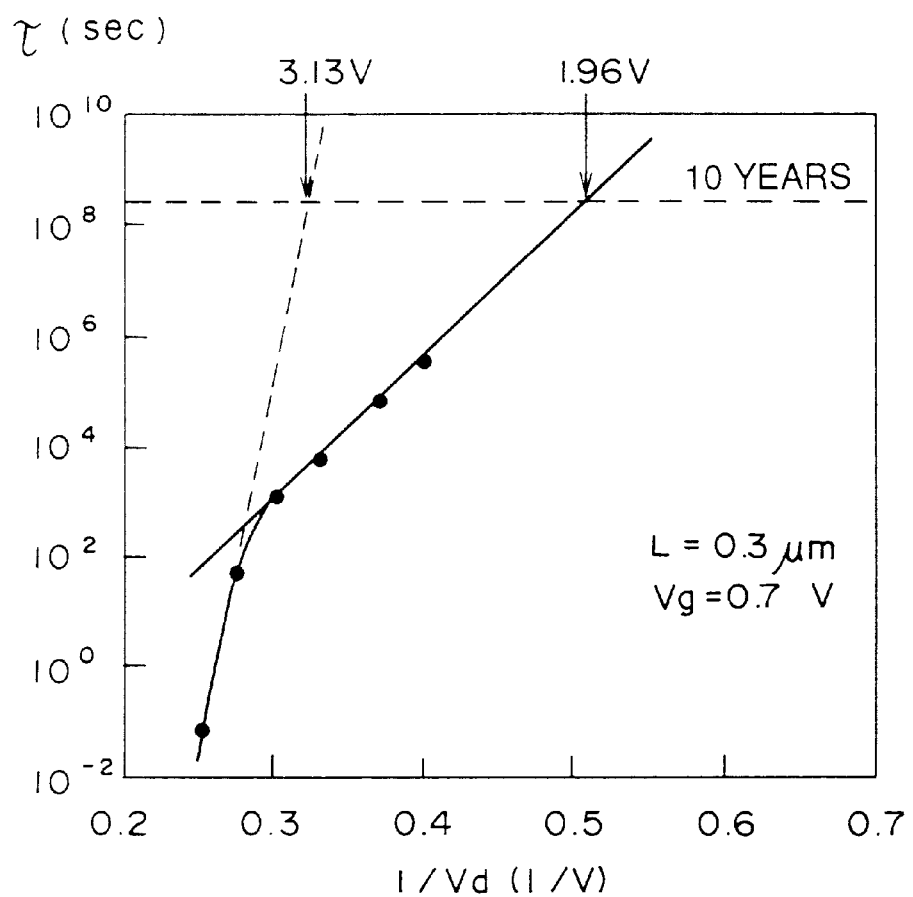
FIG. 23 is a graph showing a conventional method of estimating the lifetime of a floating SOI-MOSFET.

As described above, in a bulk MOSFET as shown in FIG. 21, the lifetime of a transistor (hereinafter referred to also as the "HC lifetime") degraded by hot carrier stress can be estimated by measuring substrate current Isub produced by holes from impact ionization occurring in the vicinity of the drain. Meanwhile, in a floating SOI-MOSFET as shown in FIG. 22, there is no substrate current Isub, but the HC lifetime can be estimated similarly to the bulk MOSFET if current $Ih^f$ produced by holes which are generated as a result of impact ionization occurring in the vicinity of the drain can be estimated.

The present inventors have found as a result of studies that an approximate value of hole current $Ih^f$ can be obtained by the following equation (1):

$$Ih^f \approx (Id^f/Id^t) \, Isub$$

where $Id^f$ represents the drain current in the floating SOI-MOSFET, and $Id^t$ and Isub represent the drain current and the substrate current in a body-fixed SOI-MOSFET, respectively. Therefore, the lifetime of a floating SOI-MOSFET can be estimated using $Ih^f$ in the equation (1) in place of Isub in the equation for estimating the lifetime of an SOI-MOSFET having a body region with a fixed potential.

Figure 1:
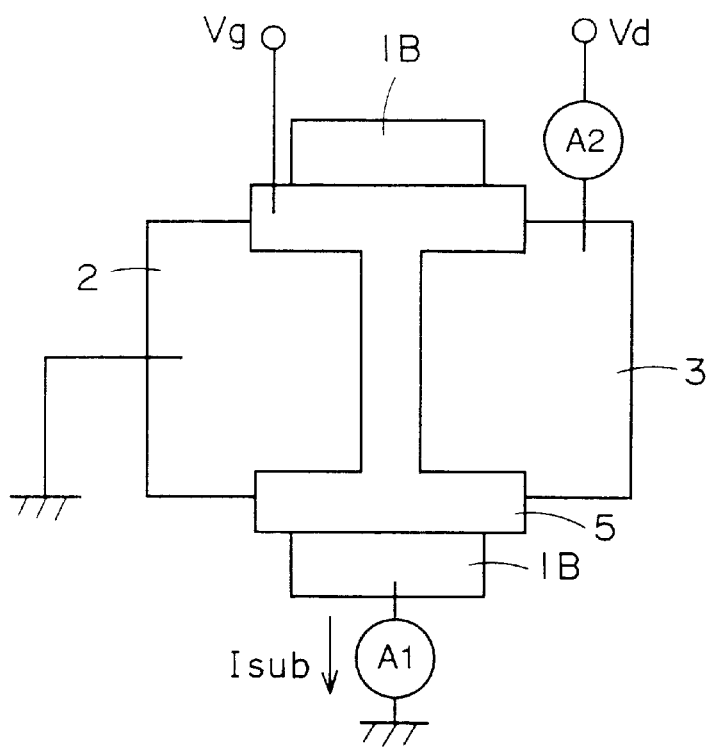
FIG. 1 is a schematic top plan view showing one example of a body-fixed SOI-MOSFET used for measurement in a method of estimating the lifetime of a floating SOI-MOSFET according to the present invention.

FIG. 1 is a schematic top plan view showing an example of a body-fixed SOI-MOSFET. Referring to FIG. 1, gate electrode 5 is formed to have an H-shape so that a body electrode 1B adjacent to gate electrode 5 can be provided. Substrate current Isub can be measured also in an SOI-MOSFET by using body electrode 1B, and this substrate current Isub, therefore, enables measurement of the HC lifetime of a body-fixed SOI-MOSFET similarly to a bulk MOSFET. It should be noted that the present invention attempts to estimate the lifetime of a floating SOI-MOSFET as shown in FIG. 22, not the lifetime of a body-fixed SOI-MOSFET as shown in FIG. 1.

In a first embodiment of the present invention, as a first step, substrate currents $Isub_1$ and $Isub_2$ and drain currents $Id_1^t$ and $Id_2^t$ are measured by two ammeters A1 and A2 corresponding to at least two stress conditions $S_1$ and $S_2$ for a body-fixed SOI-MOSFET as shown in FIG. 1 by hot carrier stress test. Then, HC lifetime $\tau^t$ of the body-fixed SOI-MOSFET is obtained under such at least two stress conditions $S_1$ and $S_2$.

Figure 2:
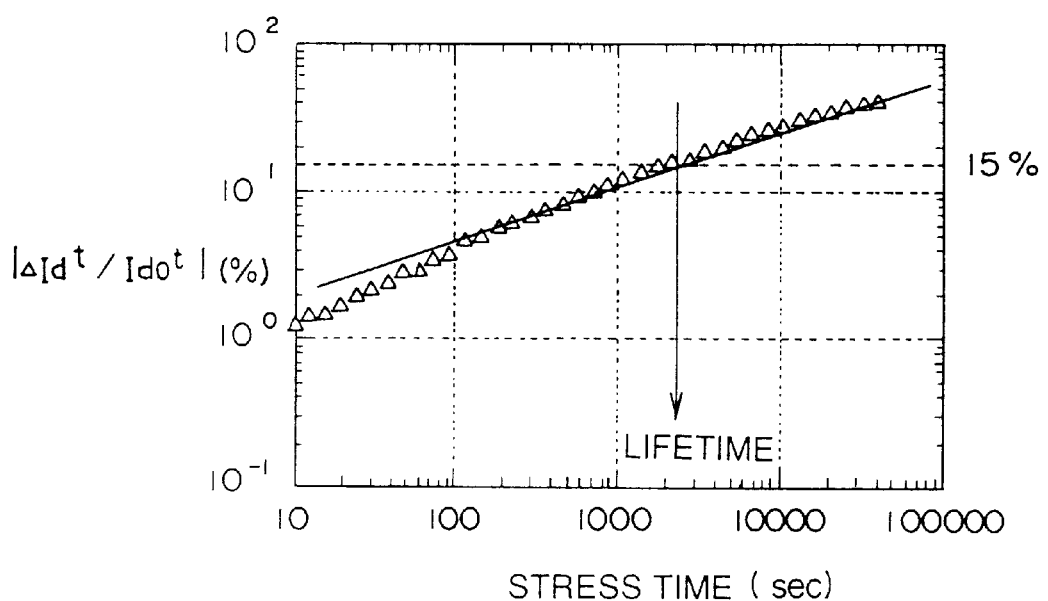
FIG. 2 is a graph showing one example of determining the lifetime of an SOI-MOSFET by hot carrier stress.

FIG. 2 is a graph representing a method of determining HC lifetime $\tau^t$ of the body-fixed SOI-MOSFET. In this graph, hot carrier stress time (sec) is scaled on the horizontal axis and shifted amount $|\Delta Id^t/Id_o^t|$ (%) of the transistor parameter is scaled on the vertical axis. Shifted amount ΔVth of the threshold voltage may also be used as the shifted amount of the transistor parameter. In the graph as shown in FIG. 2, transistor lifetime $\tau^t$ is determined when the transistor parameter is shifted to a predetermined ratio (criterion). For example, as shown in FIG. 2, lifetime $\tau^t$ is determined when amount $\Delta Id^t$ of reduction in drain current $Id^t$ reaches 15% of initial drain current $Id_0^t$. Thus, lives $\tau_1^t$ and $\tau_2^t$ are determined corresponding to at least two stress conditions $S_1$ and $S_2$ described above.

Figure 3:
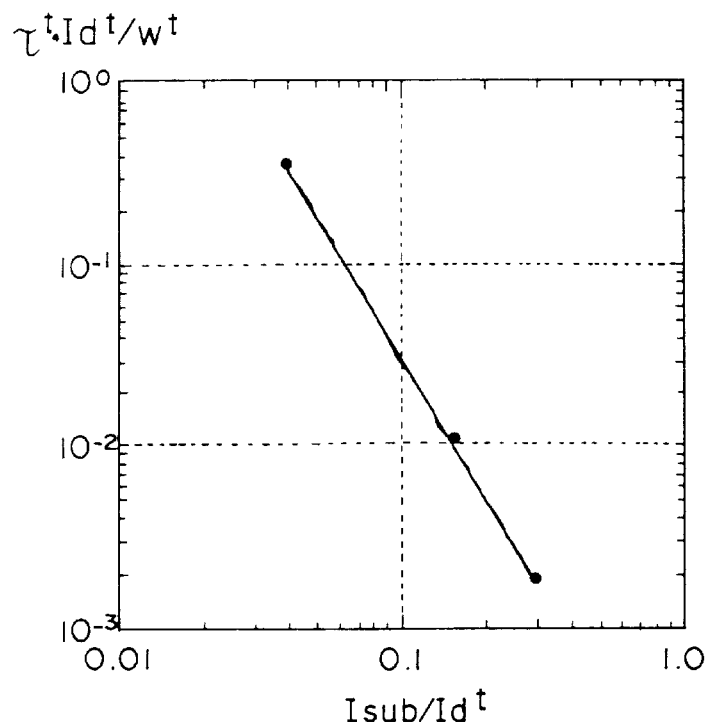
FIG. 3 is a graph showing the relation between $Isub/Id^t$ and $\tau^t \cdot Id^t/W^t$ measured in the body-fixed SOI-MOSFET.

As a second step, a graph as shown in FIG. 3 is drawn using drain current $Id^t$, substrate current Isub, and HC lifetime $\tau^t$ for the body-fixed SOI-MOSFET obtained in the first step. In the graph shown in FIG. 3, $Isub/Id^t$ is represented on the horizontal axis and $\tau^t \cdot Id^t/W^t$ is represented on the vertical axis. Here, $W^t$ represents the known channel width of the body-fixed SOI-MOSFET. In FIG. 3, measurement results under three stress conditions are plotted. Constants A and B are determined so that the following equation (2) fits the straight line in the graph of FIG. 3 (IEEE Transaction on Electron Devices, Vol. ED-32, No. 2, 1955, pp. 375–385):

$$\frac{\tau^t \cdot Id^t}{W^t} = A \left( \frac{Isub}{Id^t} \right)^{-B} \quad (2)$$

Figure 4:
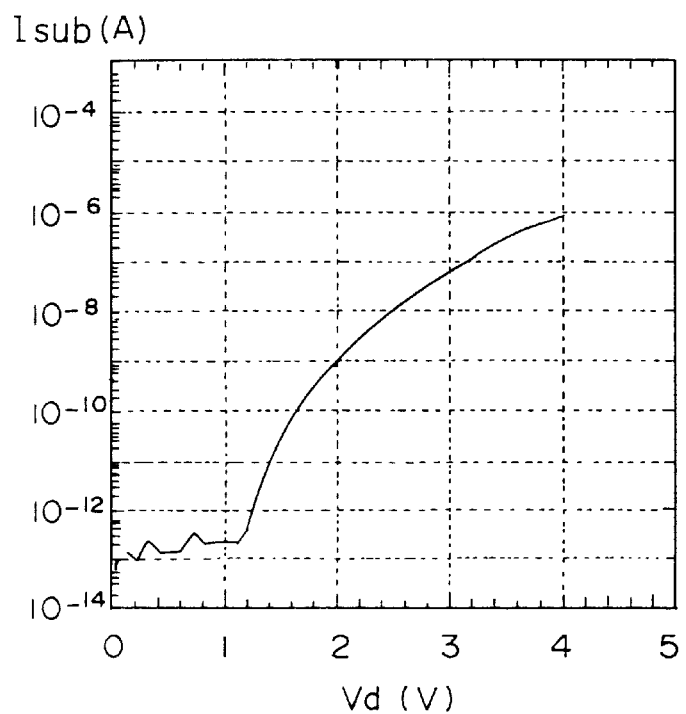
FIG. 4 is a graph showing the relation between drain voltage Vd and substrate current Isub in the body-fixed SOI-MOSFET.

As a third step, drain voltage dependency Isub(Vd) of the substrate current is measured in the transistor shown in FIG. 1. The graph shown in FIG. 4 represents one example of the measurement results. In this graph, drain voltage Vd(V) is scaled on the horizontal axis and substrate current Isub(V) is scaled on the vertical axis. In the measurement of FIG. 4, gate voltage Vg is maintained at a fixed level and drain voltage $Vd^t$ is altered from 0V to 4V. The measurement of FIG. 4 can also be utilized for obtaining substrate currents $Isub_1$ and $Isub_2$ under different stress conditions in the step 1 described above.

Figure 5:
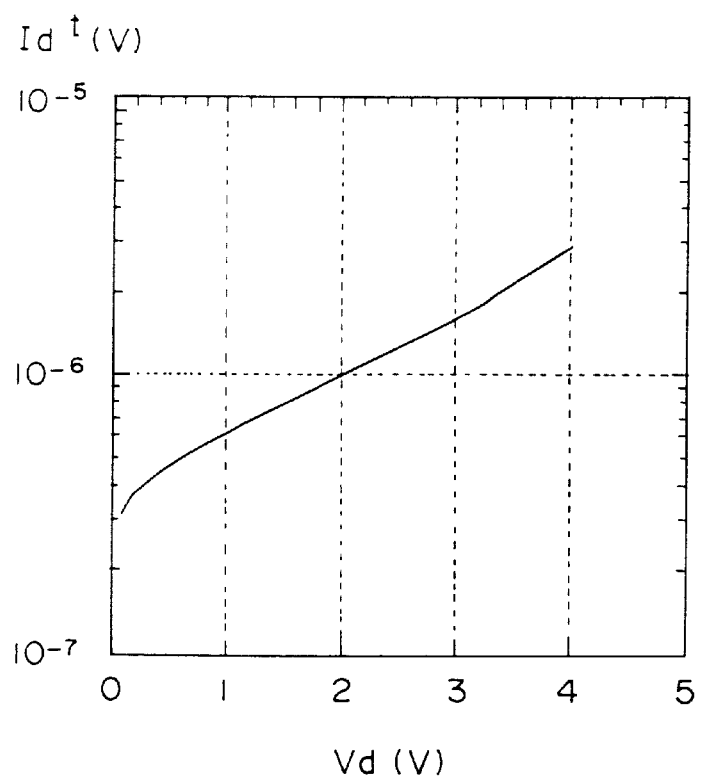
FIG. 5 is a graph showing the relation between drain voltage Vd and drain current $Id^t$ in the body-fixed SOI-MOSFET.

Similarly, drain voltage dependency $Id^t(Vd)$ of the drain current is measured at the transistor shown in FIG. 1. In this case as well, Vg is kept constant and Vd is altered from 0V to 4V as in the case shown in FIG. 4. FIG. 5 shows the relationship between $Id^t$ and Vd obtained as a result of the measurement.

Figure 6:
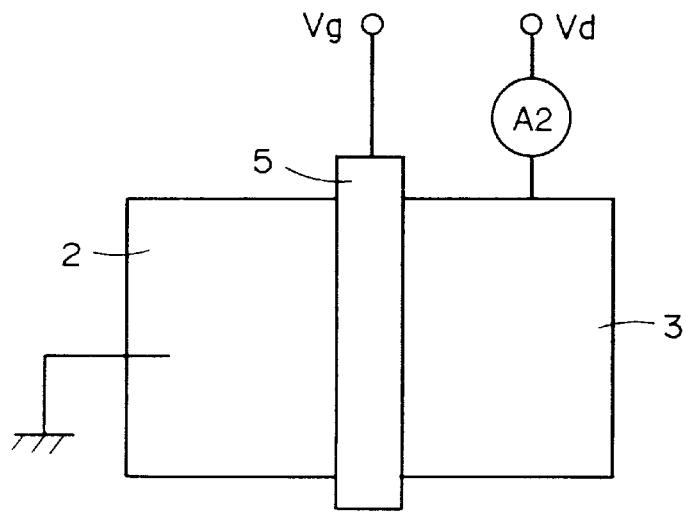
FIG. 6 is a schematic top plan view showing one example of a floating SOI-MOSFET.
Figure 7:
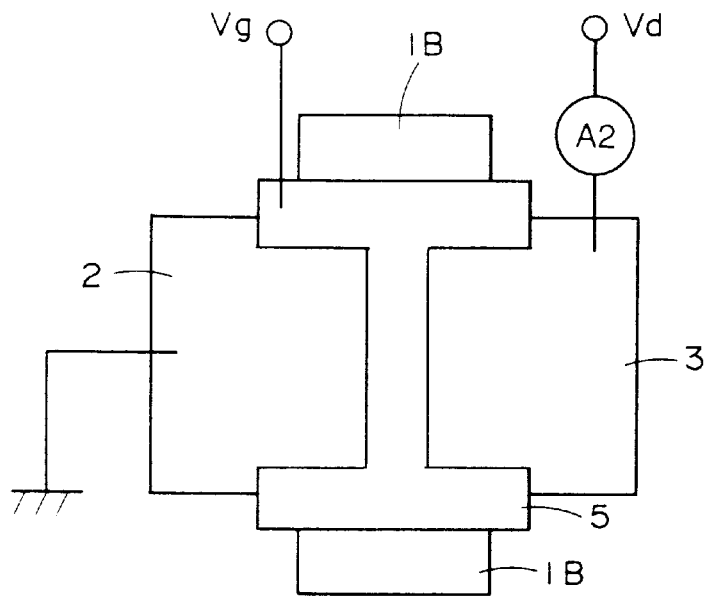
FIG. 7 is a schematic top plan view showing another example of a floating SOI-MOSFET.
Figure 8:
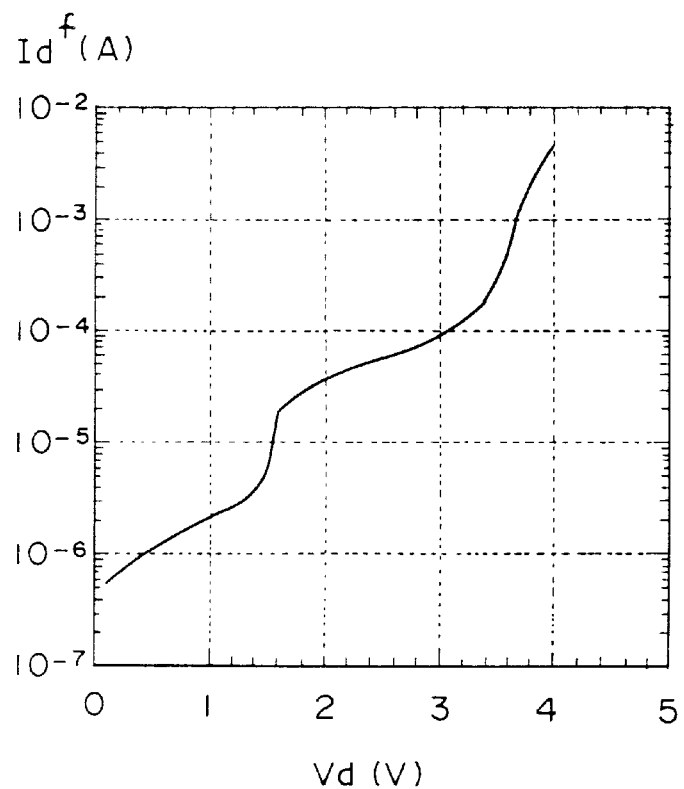
FIG. 8 is a graph showing the relation between drain voltage Vd and drain current $Id^f$ in the floating SOI-MOSFET.

Drain voltage dependency $Id^f(Vd)$ of the drain current is measured using a floating SOI-MOSFET. For this measurement, a floating SOI-MOSFET which does not have a body terminal as shown in FIG. 6 can be employed or the transistor with body terminal 1B in the floating state as shown in FIG. 7 can be used. In this measurement as well, gate voltage Vg is maintained at a fixed level and drain voltage Vd is altered from 0V to 4V as in the case shown in FIG. 4. FIG. 8 shows the relationship between $Id^f$ and Vd as an example of the result of such measurement.

As a final fourth step, HC lifetime $\tau^f(Vd)$ of the floating SOI-MOSFET can be estimated from the following equation (3) using A, B, Isub(Vd), Id(Vd) and $Id^f(Vd)$ obtained from the steps above:

$$\tau^f(Vd) = A \cdot W^f \frac{1}{Id^f(Vd)} \left( \frac{Isub(Vd)}{Id^t(Vd)} \right)^{-B} \quad (3)$$

Figure 9:
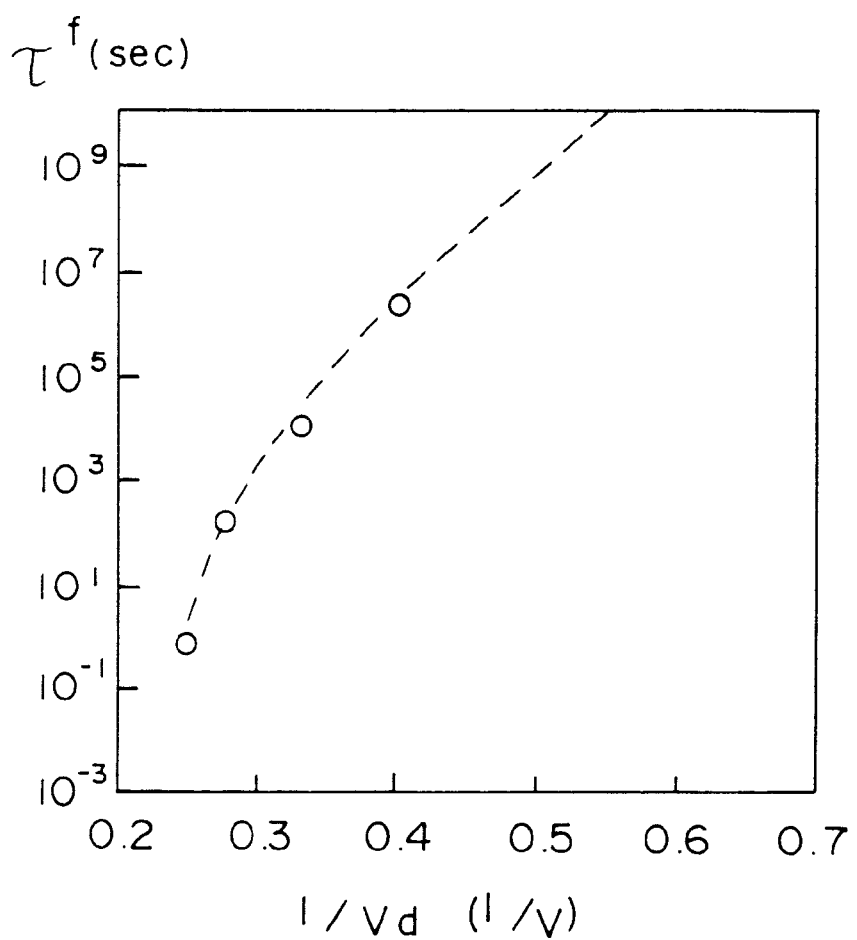
FIG. 9 is a graph showing the relation between the reciprocal 1/Vd of the drain voltage and HC lifetime $\tau^f$ in the floating SOI-MOSFET.

FIG. 9 is a graph showing the relationship between the HC lifetime actually measured in the floating SOI-MOSFET and the HC lifetime estimated in accordance with the first embodiment of the present invention. The circle in the figure represents the actually measured HC lifetime and the broken curve represents the HC lifetime estimated in accordance with the first embodiment of the present invention. As can be seen from FIG. 9, the transistor lifetime actually measured and the transistor lifetime estimated in accordance with the present invention match well both in the high Vd region (left side of the graph) and the low Vd region (right side of the graph). Therefore, the HC lifetime of a floating SOI-MOSFET can be accurately estimated only by measuring the HC lifetime of a body-fixed SOI-MOSFET.

Figure 10:
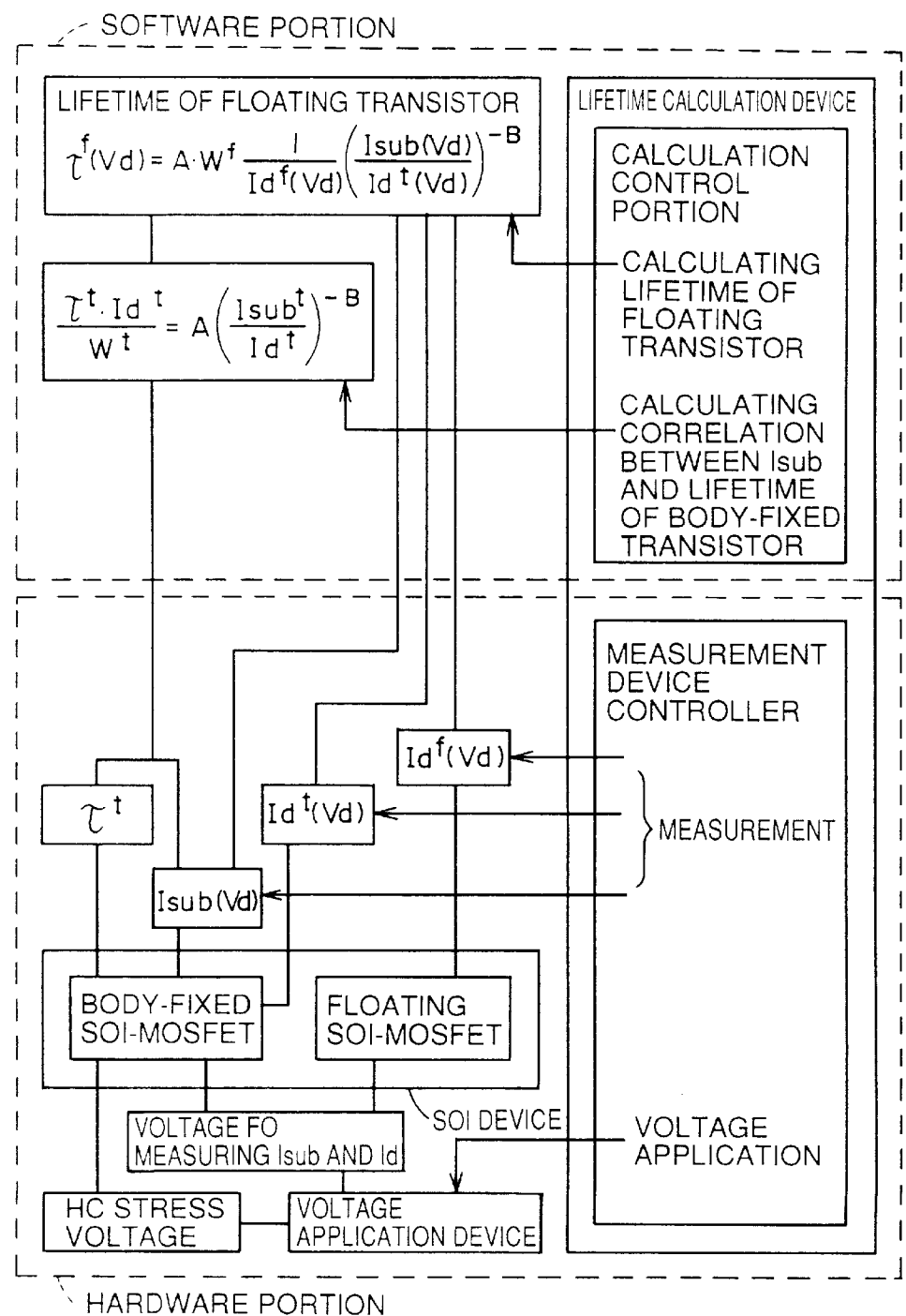
FIG. 10 is a flow chart showing the procedure in a method of estimating the lifetime of a floating SOI-MOSFET according to a first embodiment of the present invention.

FIG. 10 is a flow chart representing the procedure for estimating the lifetime of a floating SOI-MOSFET in accordance with the first embodiment described above. The procedure in the method of estimating the lifetime of a floating SOI-MOSFET using the equation (3) should be visually and more clearly understood from this figure.

It should be understood that the method of estimating the transistor lifetime described above can be applied to a bulk MOSFET having a substrate or a well in the floating state. The method can be similarly applied to estimation of the HC lifetime of a TFT (Thin Film Transistor) having no body electrode.

In a second embodiment of the present invention as well, the first and second steps are carried out similarly to those in the first embodiment.

Figure 11:
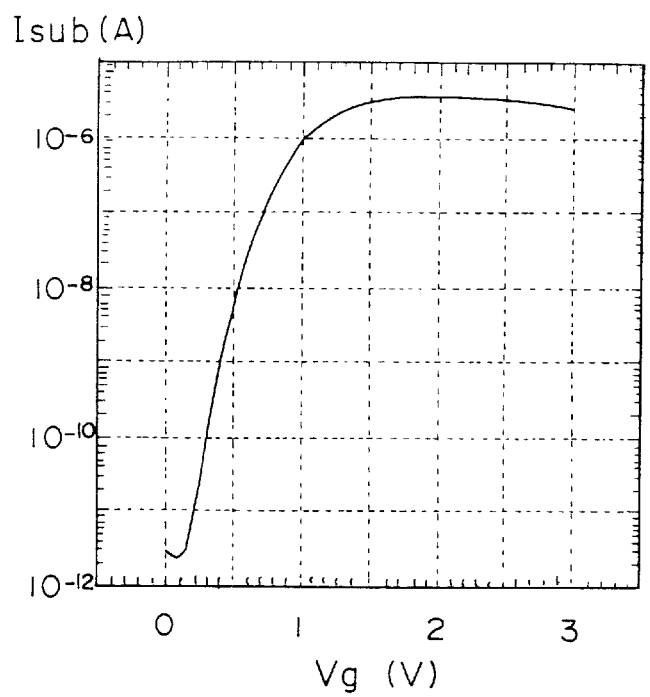
FIG. 11 is a graph showing the relation between gate voltage Vg and substrate current Isub in the body-fixed SOI-MOSFET.

In the third step, however, gate voltage dependency Isub(Vg) of the substrate current is measured using the body-fixed SOI-MOSFET as shown in FIG. 1. For example, drain voltage Vd is fixed and gate voltage vg is altered from 0V to 3.0V. One example of the result of measurement is represented in FIG. 11.

Figure 12:
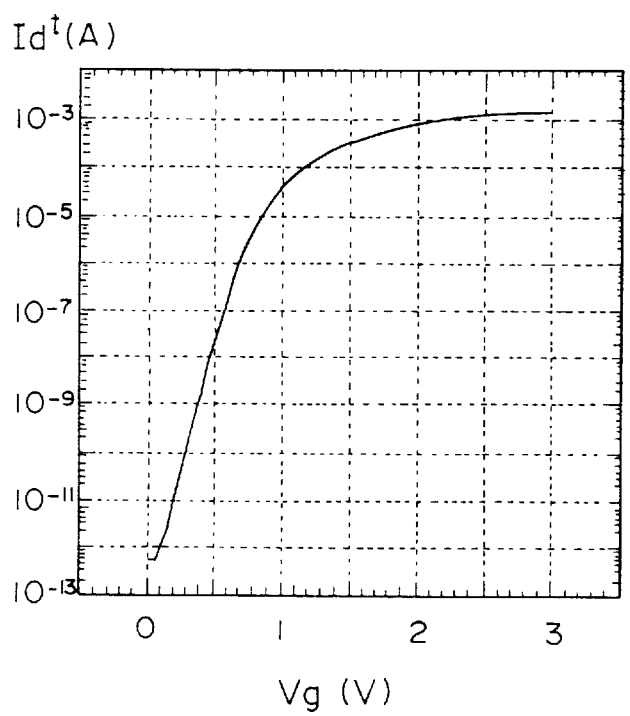
FIG. 12 is a graph showing the relation between gate voltage Vg and drain current $Id^t$ in the body-fixed SOI-MOSFET.

Similarly, gate voltage dependency $Id^t(Vg)$ of the drain current is measured using the body-fixed SOI-MOSFET as shown in FIG. 1. Here, drain voltage Vd is set at a fixed voltage and gate voltage Vg is altered from 0V to 3.0V as in the case shown in FIG. 11. One example of the measurement result is represented in FIG. 12.

Figure 13:
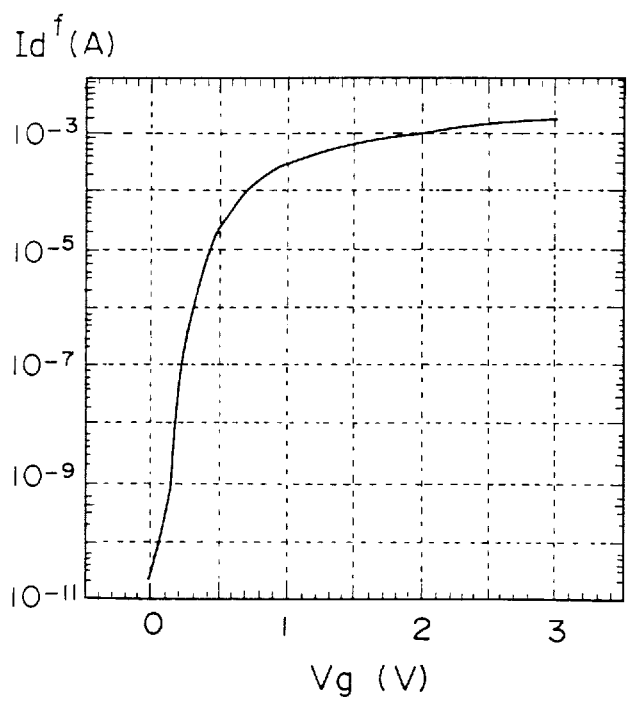
FIG. 13 is a graph showing the relation between gate voltage Vg and drain current $Id^f$ in the floating SOI-MOSFET.

Furthermore, gate voltage dependency $Id^f(Vg)$ of the drain current is measured using the floating SOI-MOSFET as shown in FIG. 9 or FIG. 10. Similarly to the case shown in FIG. 11, drain voltage Vd is set at a fixed voltage and gate voltage Vg is changed from 0V to 3.0V. One example of the measurement result is represented in FIG. 13.

As a fourth step, the lifetime of the floating SOI-MOSFET is estimated in accordance with the following equation (4) using A, B, Isub(Vg), $Id^t(Vg)$, and $Id^f(Vg)$ obtained from the steps above:

$$\tau^f(Vg) = A \cdot W^f \frac{1}{Id^f(Vg)} \left( \frac{Isub(Vg)}{Id^t(Vg)} \right)^{-B} \quad (4)$$

Figure 14:
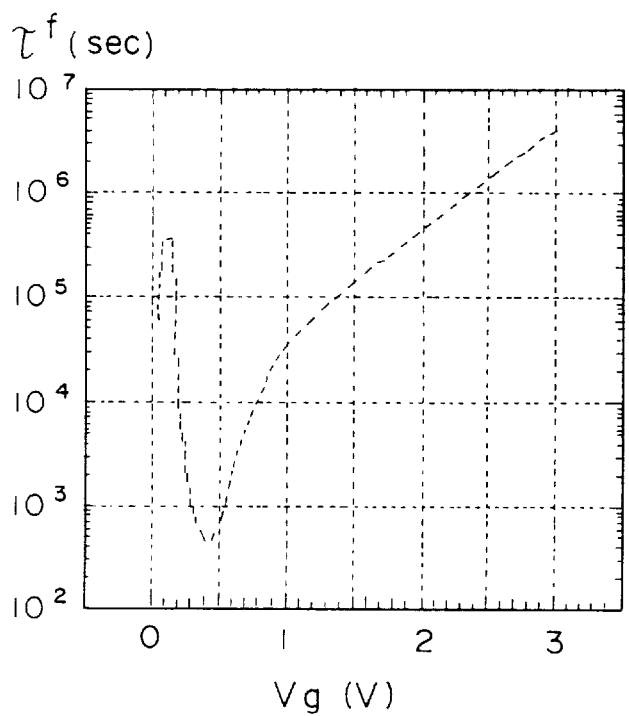
FIG. 14 is a graph showing the relation between gate voltage Vg and HC lifetime $\tau^f$ in the floating SOI-MOSFET.

FIG. 14 shows gate voltage dependency $\tau^f(Vg)$ of the lifetime of the floating SOI-MOSFET thus derived, and the value of gate voltage Vg with which the lifetime of the floating SOI-MOSFET is shortest can be easily known from this figure.

Figure 15:
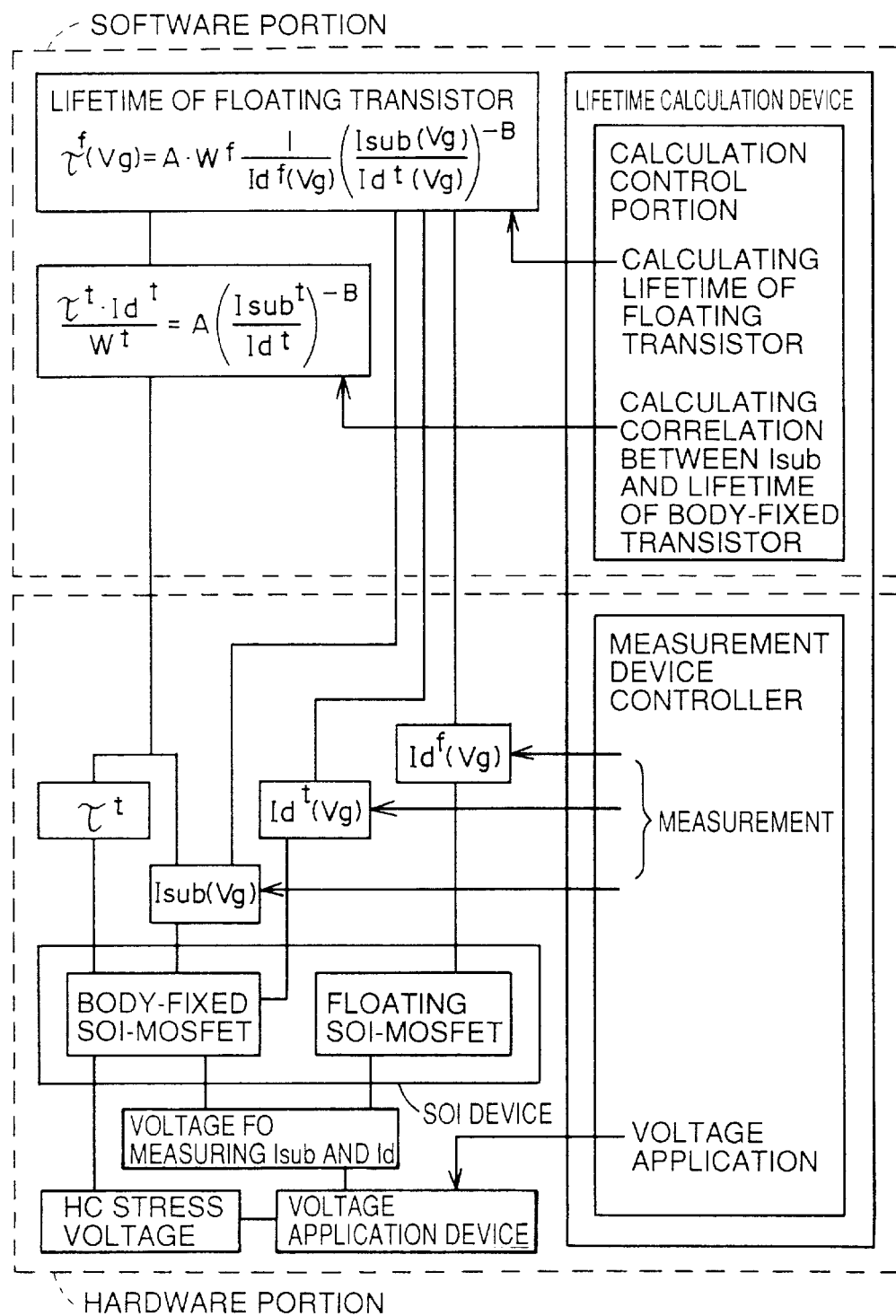
FIG. 15 is a flow chart showing the procedure in a method of estimating the lifetime of a floating SOI-MOSFET according to a second embodiment of the present invention.

FIG. 15 is a flow chart representing the procedure in the method of estimating the lifetime of a floating SOI-MOSFET in accordance with the second embodiment described above. The procedure in the method of estimating the lifetime of a floating SOI-MOSFET using the equation (4) should be clarified visually from this figure.

In a third embodiment of the present invention, the following equation (5) can be employed instead of the fourth step in the first and second embodiments:

$$\tau^f(S) = A \cdot W^f \frac{1}{(Id)^f(S)} \left( \frac{Isub(S)}{Id^t(S)} \right)^{-B} \quad (5)$$

where S represents a predetermined stress condition. S corresponds to Vd in the first embodiment and to Vg in the second embodiment. However, source voltage $V_s$ or voltage $V_{back}$ of substrate 1 under buried oxide layer 6 can be used as such stress condition.

Figure 16:
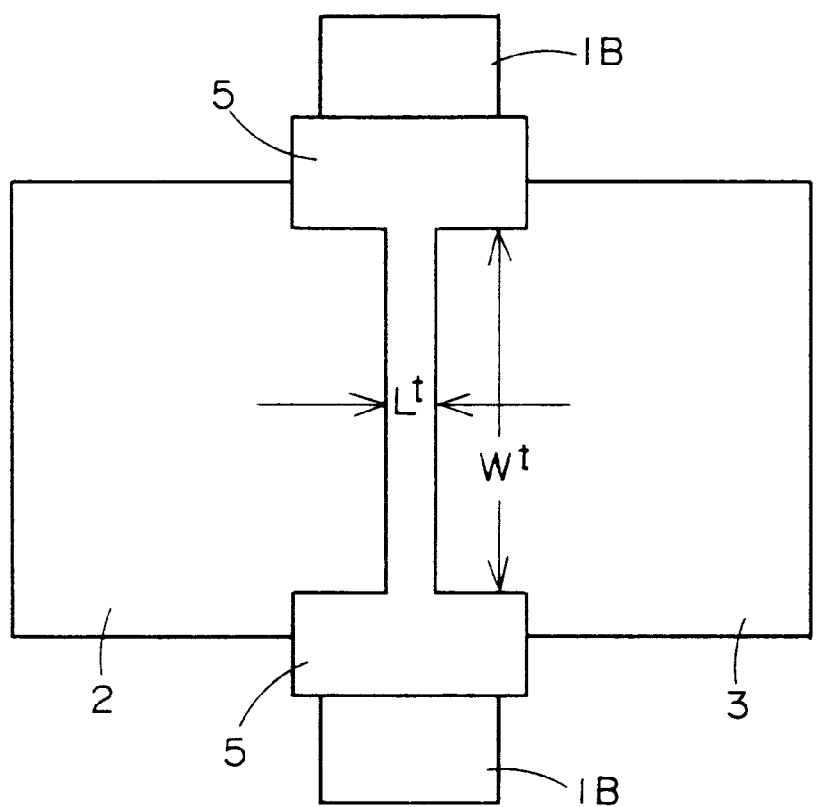
FIG. 16 is a schematic top plan view showing the relation between a channel length $L^t$ and a channel width $W^t$ in the SOI-MOSFET.

Since greater channel width $W^t$ in the body-fixed SOI-MOSFET used for measurement diminishes the effect of fixing the potential of the body region, channel length $L^t$ and channel width $W^t$ as shown in FIG. 16 desirably satisfy the relationship of $W^t/L^t \leq 15$. For example, channel width $W^t$ is set equal to or less than 5 μm with channel length $L^t$ of 0.35 μm. In a floating SOI-MOSFET, however, the value of channel width $W^f$ does not matter.

Figure 17:
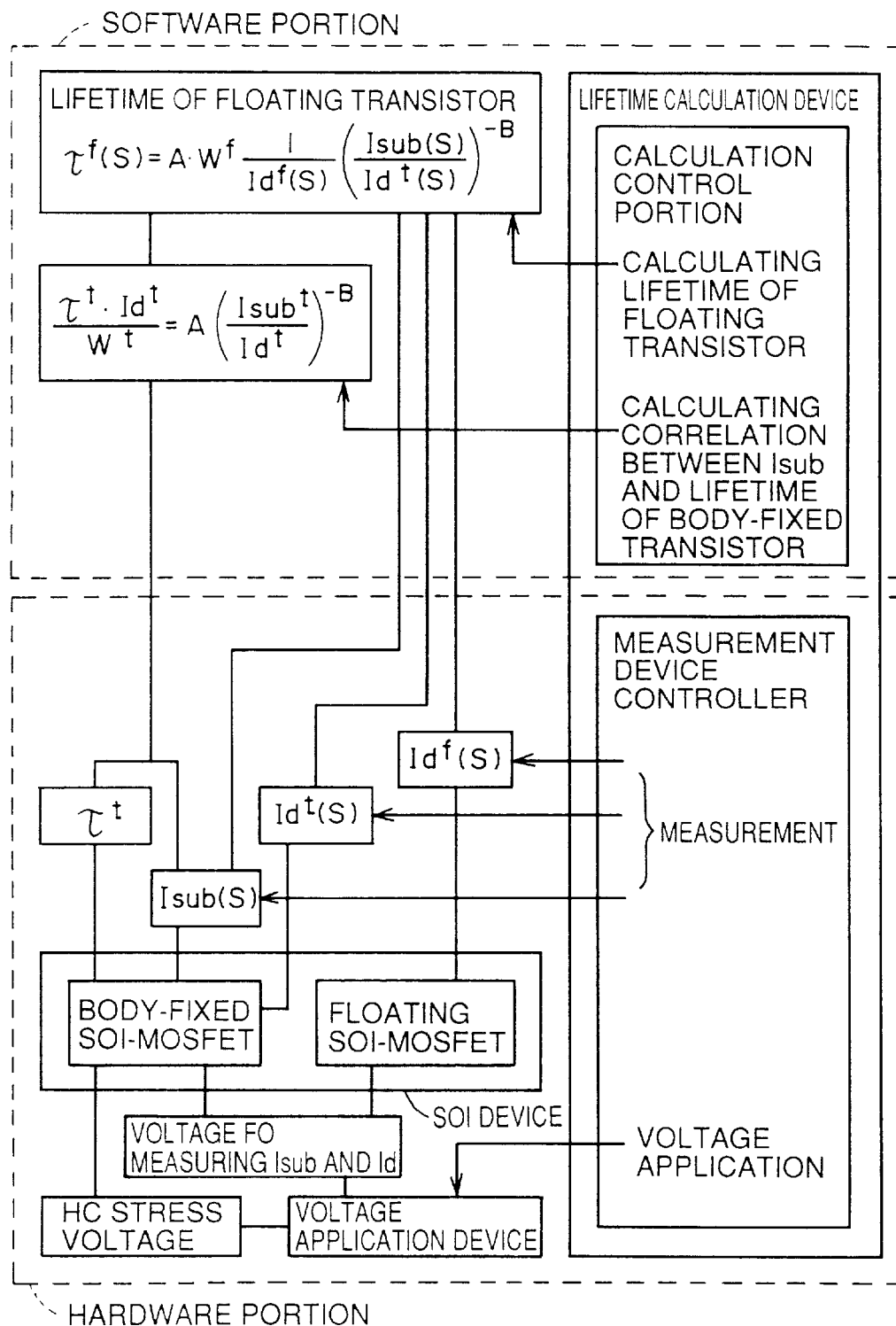
FIGS. 17 and 18 are flow charts showing the procedure in methods of estimating the lifetime of a floating SOI-MOSFET according to third and fourth embodiments of the present invention, respectively.

FIG. 17 is a flow chart representing the procedure in the method of estimating the lifetime of a floating SOI-MOSFET in accordance with the third embodiment described above. The figure should clearly illustrate the procedure in the method of estimating the lifetime of a floating SOI-MOSFET using the equation (5).

In a fourth embodiment of the present invention, m $(Isub/Id^t)$ is employed in place of $(Isub/Id^t)$ in the equation (5). In other words, the studies conducted by the present inventors have demonstrated that hole current $Ih^f$ in a floating SOI-MOSFET can be represented more accurately by the following equation (6):

$$Ih^f = m(Id^f/Id^t) \, Isub \quad (6)$$

where m can be obtained through device simulation and is generally in the range of 0.8–1.0, and m is a constant equal to 0.9 approximately in a typical SOI-MOSFET. The lifetime of a floating SOI-MOSFET can be calculated more accurately from the following equation (7) using such coefficient m:

$$\tau^f(S) = A \cdot W^f \frac{1}{(Id)^f(S)} \left( m \frac{Isub(S)}{Id^t(S)} \right)^{-B} \quad (7)$$

It should be noted that m is assumed equal to 1 in the first through third embodiments described above.

Figure 18:
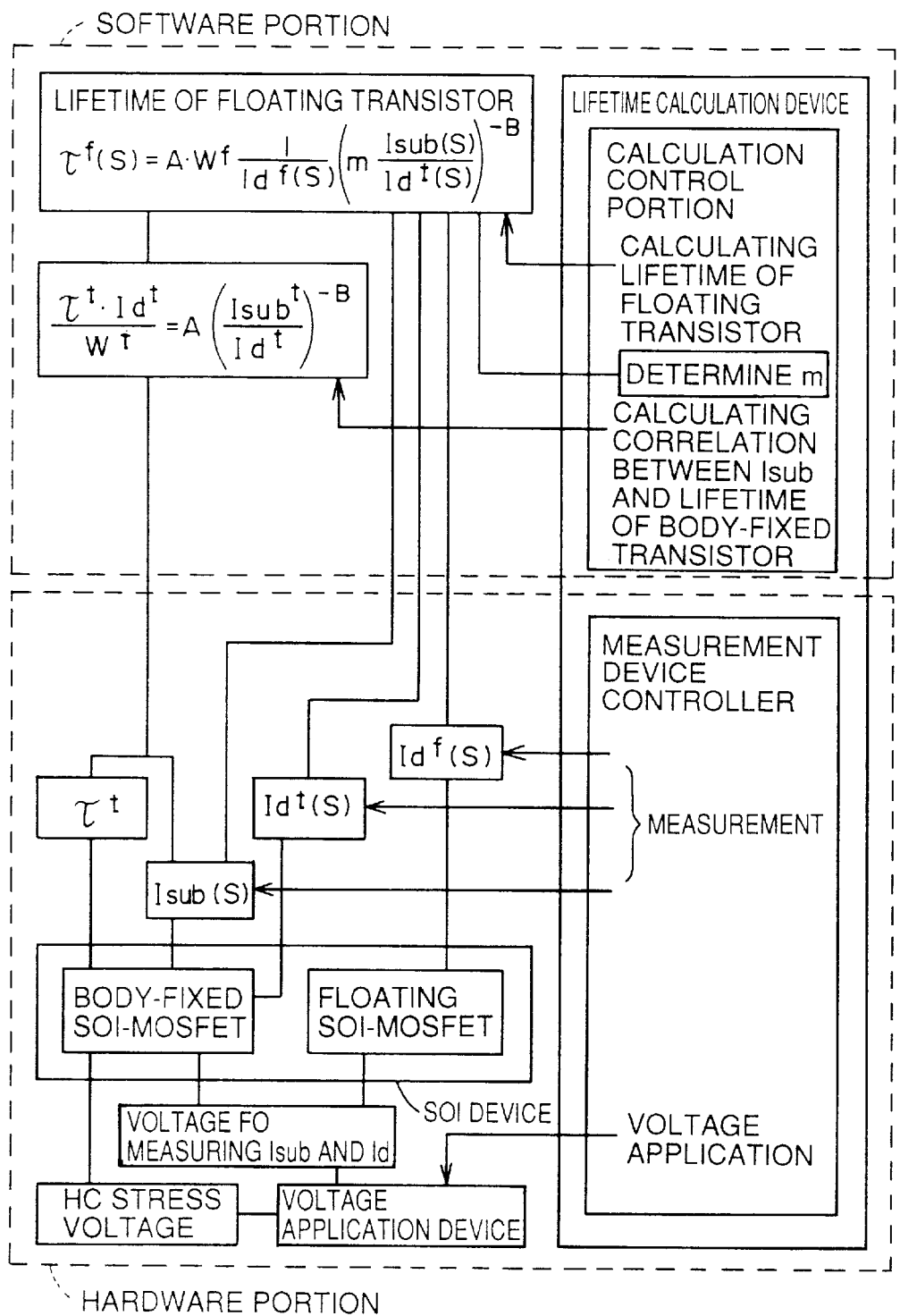

FIG. 18 is a flow chart representing the procedure in the method of estimating the lifetime of a floating SOI-MOSFET in accordance with the fourth embodiment described above. The procedure in the method of estimating the lifetime of a floating SOI-MOSFET using the equation (7) should be visually and more clearly understood from this figure.

In a fifth embodiment of the present invention, the lifetime of a floating SOI-MOSFET under AC stress condition where the stress condition periodically changes is estimated using the equation (5) above. If gate voltage Vg and drain voltage Vd at the SOI-MOSFET built into an IC can be given as a function of time Vg(t) and Vd(t), degradation in the SOI-MOSFET can be represented, for example, as $(\Delta Id/Id_0) = C_1 t^n$ or $\Delta V th = C_2 t^n$ where $C_1$ and $C_2$ are constants and t represents time. In general, if degradation in such transistor parameter is represented as the following equation (8), the lifetime of the floating SOI-MOSFET in the IC affected by AC stress can be obtained from the following equation (9):

$$\Delta = Dt^n \quad (8)$$

$$\tau^f(S(t)) = \left( \frac{1}{Tc} \int_0^{Tc} \frac{1}{\tau^t(S(t))^n} \, dt \right)^{-1/n} \quad (9)$$

where D is a constant and Tc represents the period of change in time-varying stress condition S(t). Furthermore n can be obtained by measuring the time dependency of transistor parameter Δ in the equation (8).

Figure 19:
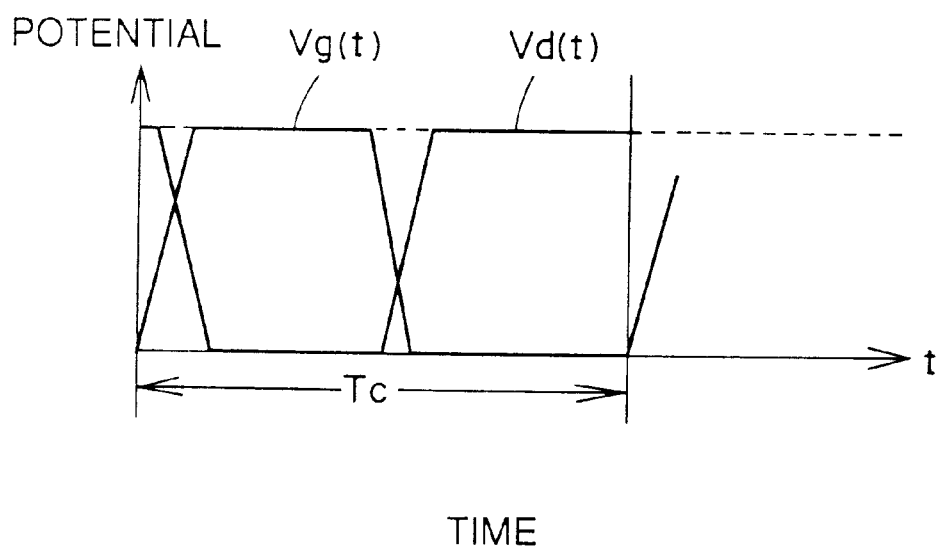
FIG. 19 is a graph showing one example of periodic stress condition in an SOI-MOSFET incorporated in an IC.

FIG. 19 shows time dependency Vg(t) of the gate voltage and time dependency Vd(t) of the drain voltage has one example of periodic stress condition S(t). When such stress condition is imposed on a floating SOI-MOSFET, the HC lifetime of the SOI-MOSFET can be obtained by averaging for one period the amount of the transistor parameter shifted by the stress condition for a short period of time.

The periodic stress condition Vd(t) and Vg(t) at the SOI-MOSFET in an IC can be obtained from circuit simulation. The approximate values can be derived from simple waves such as sine function and rectangular wave, instead of circuit simulation.

Figure 20:
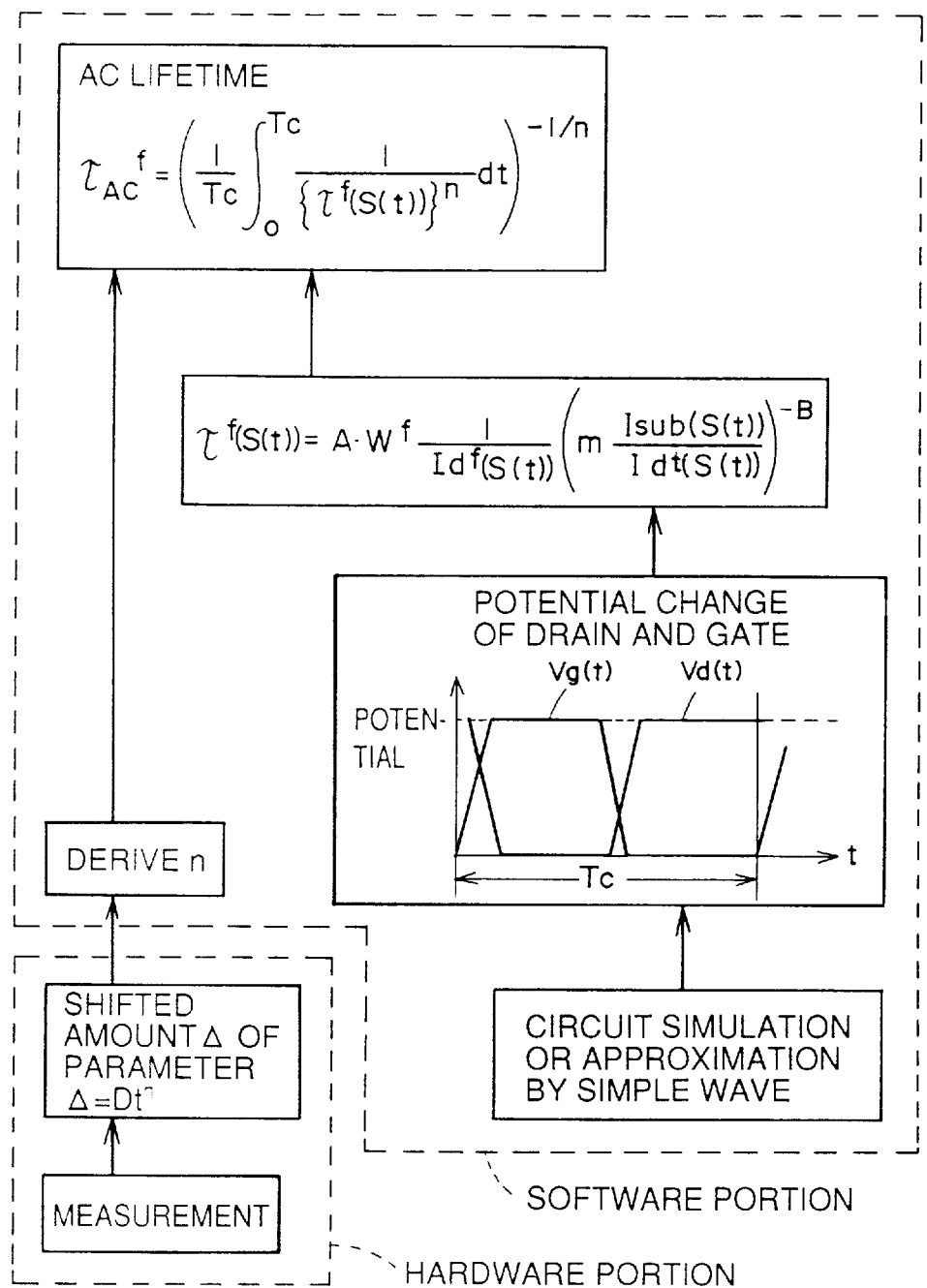
FIG. 20 is a flow chart showing the procedure in a method of estimating the lifetime of a floating SOI-MOSFET according to a fifth embodiment of the present invention.

FIG. 20 is a flow chart representing the procedure in the method of estimating the lifetime of a floating SOI-MOSFET in accordance with the fifth embodiment described above. The method of estimating the lifetime of a floating SOI-MOSFET utilizing the equation (9) should be visually and more clearly understood from this figure.

As described above, the present invention can provide a method of relatively easily and accurately estimating the lifetime of a floating SOI-MOSFET affected by hot carrier stress.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of estimating a lifetime of a floating SOI-MOSFET, comprising the steps of:
    measuring a drain current $Id^f$ in said floating SOI-MOSFET;
    measuring a drain current $Id^t$ and a substrate current Isub in a body-fixed SOI-MOSFET;
    estimating a hole current $Ih^f$ of said floating SOI-MOSFET under a hot carrier stress condition based on an approximation equation: $Ih^f \approx (Id^f/Id^t)Isub$; and
    estimating a lifetime of said floating SOI-MOSFET by using said estimated hole current $Ih^f$.

2. A method of estimating a hole current $Ih^f$ of a floating SOI-MOSFET, comprising the steps of:
    measuring a drain current $Id^f$ in said floating SOI-MOSFET;
    measuring a drain current $Id^t$ and a substrate current Isub in a body-fixed SOI-MOSFET; and
    estimating a hole current $Ih^f$ of said floating SOI-MOSFET under a hot carrier stress condition based on an approximation equation: $Ih^f \approx (Id^f/Id^t)Isub$.

* * * * *